ROTATING ELECTRIC MACHINES WITH PRINTED CIRCUIT WINDINGS

Original Filed Oct. 21, 1957 5 Sheets-Sheet 1

INVENTOR
Jacques Henry-Baudot
BY Kemon, Palmer, Stewart & Estabrook
ATTORNEYS

ROTATING ELECTRIC MACHINES WITH PRINTED CIRCUIT WINDINGS

Original Filed Oct. 21, 1957 5 Sheets-Sheet 2

INVENTOR
Jacques Henry-Baudot
BY Kemon, Palmer, Stewart & Estabrook
ATTORNEYS

Inventor
Jacques Henry-Baudot
By Kemon, Palmer Stewart &
Estabrook,
Attorneys

INVENTOR
Jacques Henry-Baudot
BY Kemon, Palmer, Stewart & Estabrook
ATTORNEYS

Aug. 11, 1964 J. HENRY-BAUDOT 3,144,574

ROTATING ELECTRIC MACHINES WITH PRINTED CIRCUIT WINDINGS

Original Filed Oct. 21, 1957 5 Sheets-Sheet 5

Inventor: Jacques Henry-Baudot
By Kemon, Palmer, Stewart & Estabrook
Attorneys

United States Patent Office 3,144,574
Patented Aug. 11, 1964

3,144,574
ROTATING ELECTRIC MACHINES WITH PRINTED CIRCUIT WINDINGS

Jacques Henry-Baudot, Antony, France, assignor, by mesne assignments, to Printed Motors, Inc., New York, N.Y.

Original application Oct. 21, 1957, Ser. No. 691,434, now Patent No. 3,090,880, dated May 21, 1963. Divided and this application Jan. 7, 1960, Ser. No. 1,128
Claims priority, application France Feb. 21, 1957
24 Claims. (Cl. 310—268)

This invention relates to rotating electric machines of the type in which the rotor is provided with a winding of the "printed circuit" type.

Part of the subject-matter of this application, and in particular the subject-matter which is illustrated in FIGURES 1 to 4 of the accompanying drawing, has been divided out of my earlier application Serial No. 691,434, now Patent No. 3,090,880, filed on October 21, 1957, as a joint application with Francois H. Raymond.

The present invention is concerned with rotating electric machines which are useful as direct current machines in which connections are made to the rotor winding through brushes which are positioned to have sliding contact with parts carried by the rotor.

An object of the invention is to devise a rotor structure for a direct current machine in which the usual commutator is eliminated and the brushes have direct contact with the individual turns of the rotor winding.

A further object of the invention is to devise a novel rotor construction in which the winding of the rotor is formed on a thin carrier presenting on opposite faces thereof two winding surfaces each in the form of an endless or closed-loop band, the turns of the winding being formed of a series of half-turn conductors individually bonded to one face of the carrier transversely of and spaced throughout the endless winding surface of that face, and a second set of half-turn conductors individually bonded to the opposite face of the carrier transversely of and spaced apart throughout the closed-loop winding surface thereof, the two sets of half-turn conductors being interconnected at the edges of the closed-loop winding surfaces to form at least one closed circuit in which alternate conductors are located on opposite faces of the carrier.

Another object of the invention is to devise a brush arrangement for cooperating with the novel rotor winding wherein the brushes are positioned to have direct sliding engagement with one set of half-turn conductors.

Still another object of the invention is to devise adjustable means for controlling the magnetic flux supplied from the stator to the rotor of the machine.

The invention will be described in connection with the accompanying drawing in which:

FIGS. 1 and 2 respectively show two partial cross-sections of machines according to the invention representing two ways of establishing cooperation between rotor and stator parts in such machines;

Figure 4:
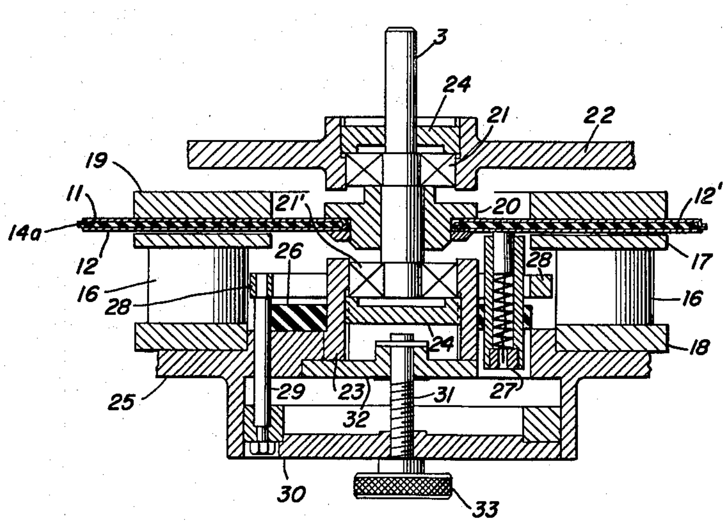
FIG. 4 shows a cross-section through the entire mechanical structure of an example of such machine.
Figure 7:
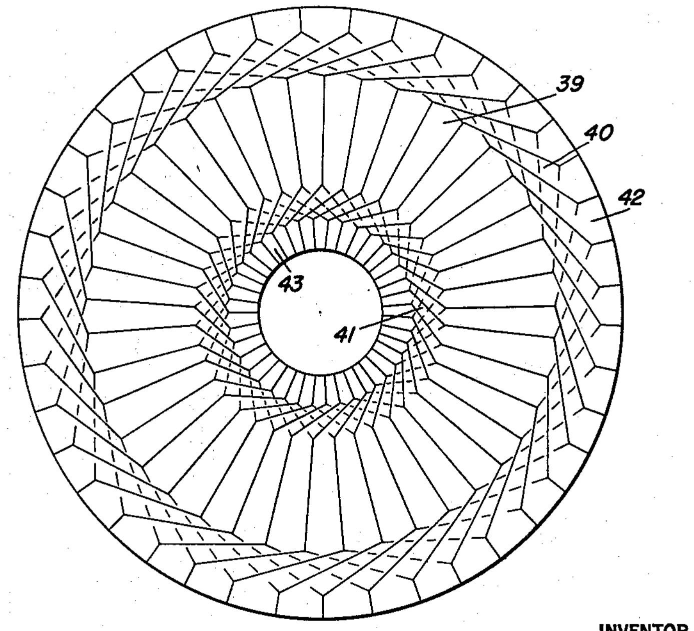
Figure 8:
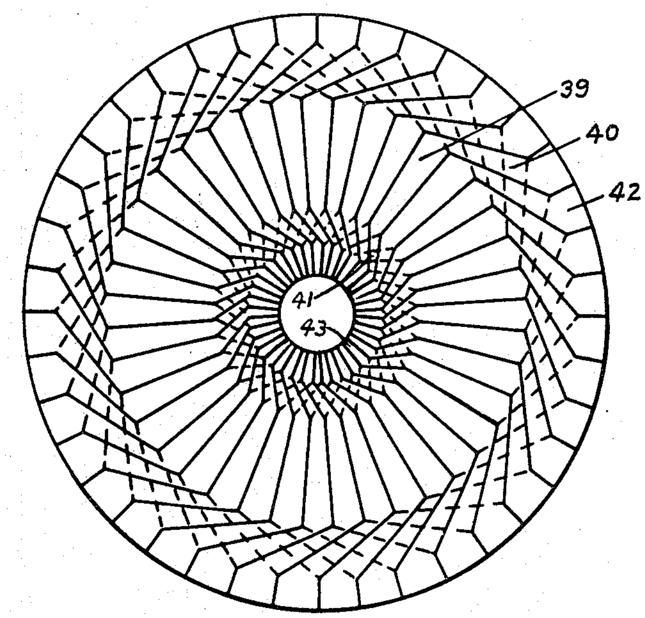
Figure 9:
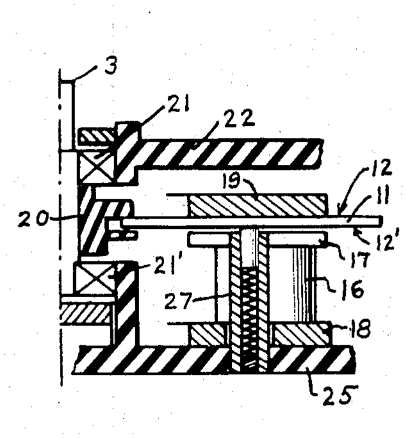
Figure 10:
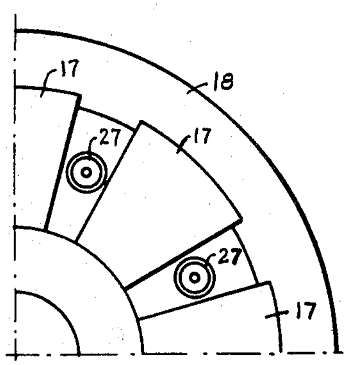
Figure 11:
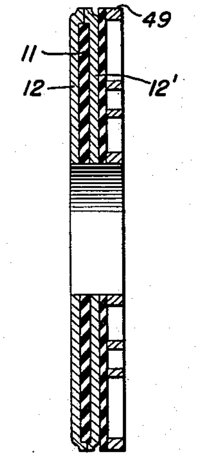
Figure 12:
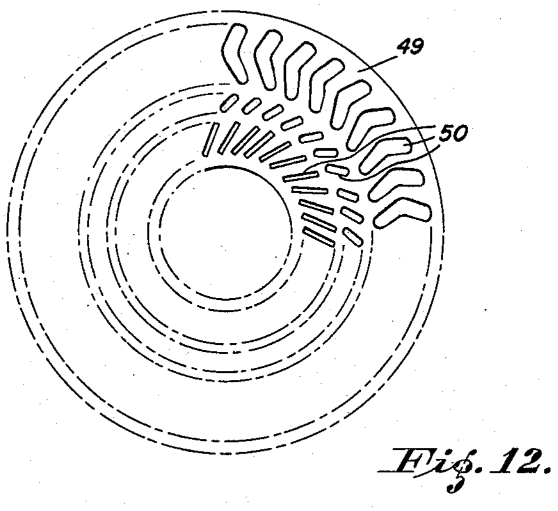

FIGS. 7 and 8, respectively, show front views of a wave-winding and of a lap winding members according to the invention;

FIGS. 9 and 10 show partial cross-section and front views of a modification of the machine of FIG. 4;

FIG. 11 shows an alternative structure for a rotor member of machines according to the invention;

FIG. 12 shows a front view of one part of the rotor structure of FIG. 11; and

Figures 1, 2, 3:
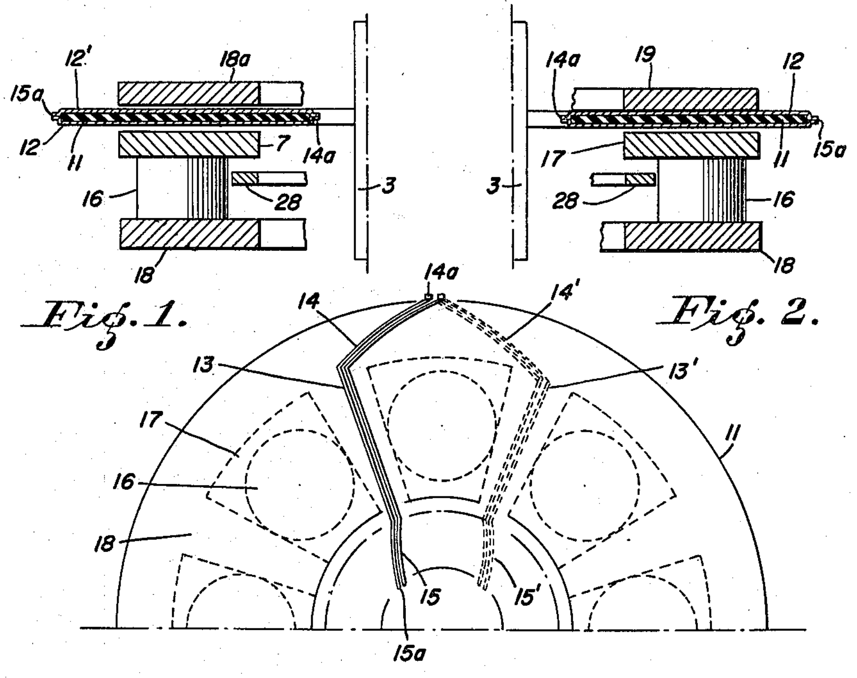
FIG. 3 shows a partial front view of the rotor member.

FIGS. 13 to 22 show different forms of winding for the winding member of FIG. 3.

With reference to the arrangements of FIGS. 1 to 4, the rotor consists of a winding printed on both sides of a thin supporting disc 11 which, at the outset, may be considered as consisting of dielectric material. The type of winding shown is what is known as series-wave winding, of multipolar character. Supporting disc 11, of about one millimeter thickness, for instance, carries the two-faced winding 12, 12' with turns shaped and arranged as apparent from the two turns shown in FIG. 3. A winding turn comprises on each face of dielectric disc 11 a radially extending conductor portion 13 or 13' with curved end portions 14, 15 or 14', 15' which serve as interconnections and for other purposes as will be explained further below.

The stator consists principally of a magnetic ring 18 having an annular surface with a plurality of permanent magnets 16 arrayed thereon. Each magnet 16 is provided, if required, with a pole piece 17 which may be in the form of a sector of an annulus, see FIG. 3. The resulting annular array of polar pieces 17 is mounted opposite to and facing one set of radial portions 13 of the winding conductors arranged on one face of the rotor disc 11.

In the embodiment of FIG. 1, another magnetic ring **18*a* is mounted on the other side of the rotor disc 11** and is attached to the housing of the machine not shown.

In the embodiment of FIG. 2, however, the flux lines from adjacent pole tips 17 are closed through a magnetic ring 19, attached to rotor disc 11 on the side away from that facing the annular array of polar pieces 17. Such an arrangement results in a very high ratio of torque to current.

Constructing the inductor part of the machine from permanent magnets leads to a substantial structural economy because such magnets are now commercially available in the form of sintered magnetic tablets. However, it is always desirable to provide some kind of induction adjustment, and in this case, as a subsidiary feature of the invention, a magnetic shunt ring is inserted at 28 coaxially with the annular array of permanent magnets. This shunt ring 28 is axially movable towards and away from pole pieces 17 to adjust its effect with respect to the annular array of magnets.

In this respect, with special reference to FIG. 4, it will be noted that the rotor 11 is mounted on a hub 20 joined with shaft 3 of the machine. Shaft 3 is mounted between bearings 21, 21' attached to supporting pieces 22 and 23 by means of clamping rings such as shown at 24. The stator is secured to a base plate 25. Base plate 25 also supports a plate 30 on a threaded shaft 31 which is journalled in an aperture of a plate 32 rigidly attached to base plate 25. Plate 30 carries a number of posts 29 which extend through apertures in plate 25 and support annular magnetic ring 28. By rotating knob 33 and driving shaft 31, the axial position of magnetic ring 28 may be conveniently adjusted to vary the magnetic shunt effect of ring 28 with respect to the permanent magnets of the polar array 16.

FIG. 4 further shows another feature of a machine according to the invention as applied to the elimination of a commutator, unless the machine is intended to operate as an A.C. generator or a rotary converter. In the latter cases a set of conventional collecting rings must be associated with the structure.

The conventional commutator may be omitted by using parts of the printed conductor winding as a commutator, for example, parts such as shown in FIG. 3 at 15, 15' or 14, 14'.

In the structure shown in FIG. 4, the brushes are shown to cooperate with inclined portions 15 of the rotor winding, each brush consisting as usual of a contact piece elastically mounted within a brush holder 27. Brush holders 27 are mounted around an annular supporting member or ring 26 attached to base plate 25 of the machine and formed of insulating material.

It is apparent that in such a commutator arrangement the number of commutator bars or "blades" equals one half of the total number of conductors of the armature winding (considering a D.C. machine), and are also evenly distributed over both sides of the supporting disc of the rotor which evidently enhances the commutation process.

In printing the rotor winding, the face-to-face interconnections may be made over the outer and inner edges of supporting ring 11. This, for example, may be achieved in the following manner:

Two copper foils, each of a diameter larger than that of annular ring 11, are provided each on one of their faces with a pair of annular coatings of a material such as indium adapted to be brazed under pressure without the application of heat. Such a coating may be made by an electro-plating process. The inner annular coating of indium has an outer diameter equal to the inner diameter of ring 11; the outer annular coating of indium has an inner diameter equal to the outer diameter of ring 11. The copper foils are glued or cemented to the respective faces of ring 11 with their indium-coated sides facing one another. A conventional photo-etching process is applied thereto so that networks of conductors are formed on both faces of the sandwich, each conductor terminating at both ends in a tab which does not have contact with the supporting ring 11, see tabs 14*a* and 15*a*. Thereafter pairs of corresponding tabs will be pressed into contact with each other under pressure and consequently will be brazed or bonded to each other. Thus, each pair of these tabs forms a conducting bridge over the edge of ring 11 to interconnect corresponding pairs of conductors arrayed on opposite sides of ring 11, see FIGURES 1 and 3 where 15*a* indicates the outer pairs of connected tabs and 14*a* the inner pairs of connected tabs.

For certain applications such as servo-mechanisms, furthermore, electrical rotating machines according to the invention present, as an essential advantage, a very high acceleration torque if the rotor is of very small inertia. In such applications, however, the motor torque must be as uniform as possible with respect to time or angular position, and a certain degree of damping must be insured. This especially applies to using the machine as a D.C. motor driving a potentiometer in a unitary structure and including a position feedback control from the potentiometer to an input of a conventional high gain amplifier feeding and operating the motor.

Such a damping, of course, may also be introduced by means of a special damping device attached to the motor shaft for a conventional dash-pot.

Figure 6:
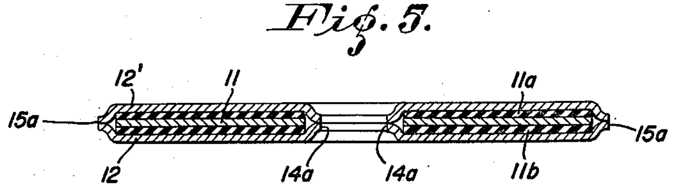
FIG. 6 shows a cross-section, of enlarged thickness, of the rotor member of FIG. 5 and embodying damping means.

In this case, according to a subsidiary feature of the invention, damping is applied directly to the rotor of the machine by means of eddy currents. This is done by making the disc or ring supporting the printed rotor winding of a suitable material, viz., a conducting material such as copper, aluminum or even iron, or a combination of such metals. This is shown in FIGURE 6 where the supporting ring 11 is of metal and is covered with sheets or layers 11*a* and 11*b* of insulating material on which the double-faced winding 12, 12' is formed.

Such conducting supporting ring will act as a secondary short-circuited winding for the rotor winding proper and the eddy currents generated, as known per se, will produce a damping or braking torque proportional to the speed of rotor rotation. The value of this torque may be conveniently adjusted during manufacture of the rotor because it is inversely proportional to the resistance of the material and determined by such factors as the thickness of the material and its intrinsic resistivity.

Figure 5:
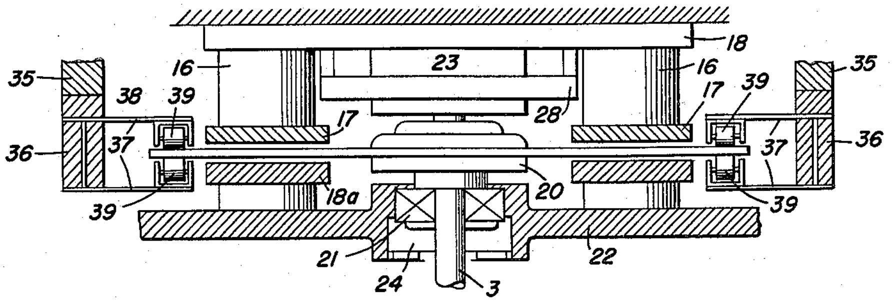
FIG. 5 shows a partial cross-section of a modification of the machine of FIG. 4.

FIGURE 5 shows a modified arrangement wherein the brushes have contact with the two-faced winding at the outer peripheral portion of the rotor.

The motor armature brushes are mounted in brush holders 36 uniformly distributed around an annular supporting piece 35. Each brush includes a pair of flexible conducting blades 37 supported in parallel relation from holder 36 so that the free ends of the blades are on opposite sides of armature disc 11. Two roller-carriers 38 having rollers 39 journaled therein are mounted on the free ends of blades 37 so that the rollers 39 engage opposite faces of the annular portion of disc 11 extending beyond ring 17. Each roller consists of a good conductor material such as silver. Each pair of rollers pinches the outer edge of the rotor at a place where printed conductor sections 14 are rather steeply sloped with respect to the radial direction of the rotor. Since the winding is multipolar and series-wave type, there will be an odd number of commutation conductors, and as the number of brushes is made even, for instance eight, no simultaneous commutation occurs under these brushes. Each pair of rollers pinches the outer edge of the winding at a place where printed conductors are available. Such an arrangement is of advantage for guiding the movement of the carrier of the rotor winding.

In another modification, FIGS. 9 and 10, the brushes are located at the middle of the rotor winding and pass between the polar tips 17 of the inductor or stator. Thus, the brushes may engage one set of half-turn conductors at any point along their length.

Whatever the actual place or location of the brushes may be with respect to the rotor winding, in such a commutatorless arrangement, the number of "blades" engaged by a brush during one revolution of the rotor equals one-half of the total number of conductors of the armature winding, which obviously improves the commutation process.

The number of brushes may be varied at will. For instance, only a pair of brushes are necessary for a series-wave winding but when the pattern is of the mesh or lap type, as many pairs of brushes are required as there are pairs of poles in the machine.

It may be of advantage, for printing purposes to form the winding on a "carrier" ring which actually does not effectively support itself. Such a non self-supporting winding may then be glued or otherwise attached to a rigid member 49, FIG. 11, and, considering that such a rigid mechanical supporting member will be in the air-gap of the machine, it is of advantage to form it as a ring of such material as steel or the like. As in most cases, such a material, for economical reasons, will be at least partially conducting, and a damping effect would be obtained as explained above but in most cases, and except where wanted, this damping is to be avoided. To such an end, the member 49 is provided with a great number of cavities or apertures formed therein throughout its surface, as shown for instance in FIG. 12, so that the degree of unwanted damping will be quite small indeed.

Whereas in FIG. 3 the winding conductors are somewhat schematically shown, FIG. 7 shows a practical form of a wave winding and FIG. 8 a practical form of lap or mesh winding.

In each of these embodiments, the half-turn conductors are all alike, each comprising a radial sector-shaped portion 39 which is continued at its outer end by an inclined portion 40 which terminates in a sector-shaped terminal portion or tab 42. The radial portion 39 is continued at its inner end by an inclined portion 41 which is terminated by a sector-shaped terminal portion or tab 43. It will be recognized that radial portion 39 corresponds to portion 13 in FIGURE 3 and that inclined portions 40 and 41 correspond to inclined portions 14 and 15 of FIGURE 3, while tabs 42 and 43 correspond to tabs 14a and 15a, respectively.

In FIGS. 7 and 8, as well as in FIGS. 13 to 22, the solid lines between adjacent conductors represent narrow gaps between conductors carried by the carrier insulating support. FIG. 7 shows a 41 turns wave winding, FIG. 8, a 40 turns mesh or lap winding. The main difference between these two types of windings is in the direction of inclination of the inclined portions 41.

In such structures, the transverse section of each half-turn conductor, i.e., a section along any arc of a circle cutting the conductor, substantially varies with the radius of the circle from one terminal to the other one along the conductor. In some cases this may not be wanted. In such cases, variations of the transverse section may be made more uniform, as shown in either FIG. 13 or FIG. 14. In both these figures, the central active portion 51 of the conductors has a constant width for each radius along its length. The same substantially applies to the inclined portions 52 in FIG. 13 and in FIG. 14. If desired, the same condition could be applied to the portions 41.

Figure 13:
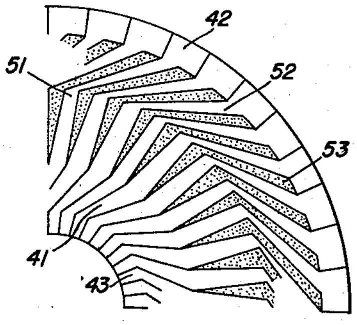
Figure 14:
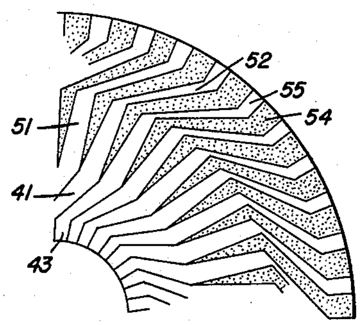

Each of the conductor-free surfaces 53 in FIG. 13 and 54 in FIG. 14 is preferably suitably covered with a non-conducting magnetic material having the same thickness as the conductors but separate therefrom. The difference between the structures of FIGS. 13 and 14, which are in the other respects substantially similar from a technical point of view, lies in the manner in which said structures are derived from the structure of FIG. 7. In FIG. 13, the pattern is obtained from the one in FIG. 7 by eliminating a portion of the conductors from one of the edges of the conductors of FIG. 7. In FIG. 14, the surfaces removed from the conductors of FIG. 7 are taken from both edges. In the first case, the terminals 42 are preserved thus preserving the symmetry of the half-turns from one face to the other one, insofar as the interconnections are concerned. In FIG. 14, on the other hand, the terminals are symmetrically reduced since the method of removal of conducting material preserves such a symmetry.

The structures of FIGS. 13 and 14 may be adapted to lap windings in an obvious way when considering the adaptation from wave winding to lap winding from FIG. 7 to FIG. 8: the direction of inclination (tilt) of the inner slanted or incurved portions of conductors is merely reversed while the number of turns is made even (this number is always odd for a wave winding as obvious).

Figure 15:
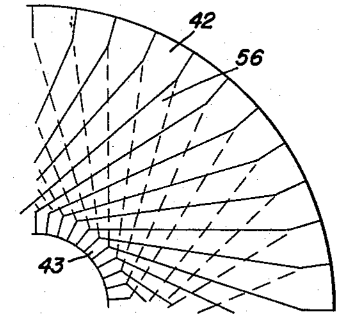

From another point of view, it is advantageous to so provide the pattern of conductors that the useful radial span of the winding is increased. This can be made principally by reducing the spans of the inclined portions of the conductors and, of course, the total elimination thereof is shown in FIG. 15 where slanted conductors 56 directly join the end terminals 42 and 43 in the winding conductors. However, this structure which is quite simple to obtain, especially from a method comprising the cutting and glueing of conductors onto an insulating carrier, presents two limitations: first, it cannot be applied to lap windings, secondly, it can be efficiently operated only if the number of poles is quite high as these poles must be very closely spaced in the inductor structure.

Figure 16:
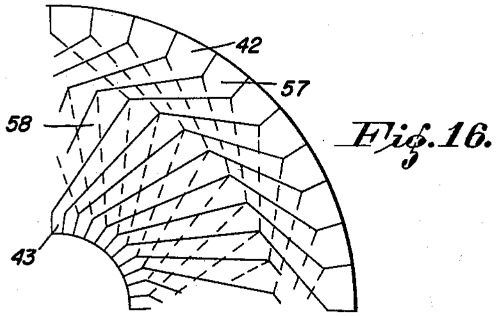
Figure 17:
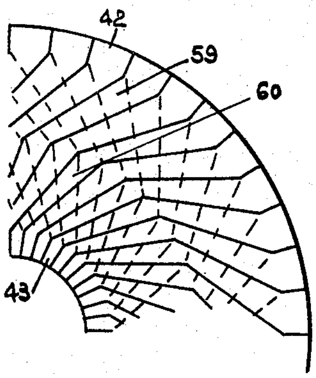
Figure 18:
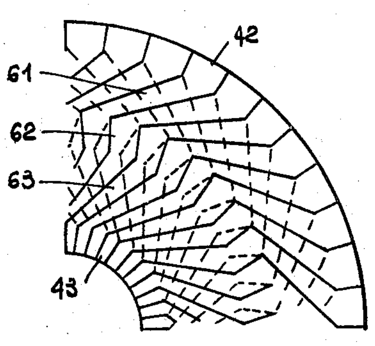

In order to avoid such limitations, recourse may be had to such patterns as shown in FIGS. 16 and 17, wherein the surface or area enclosed by each turn is further substantially increased. In the pattern of FIG. 16, the outer inclined portions 57 are preserved as such as in FIG. 7 (or 8) and the inner inclined portions omitted so that conductors 58 directly connect the inner terminal portions 43 to the inclined portions 57. In FIG. 17, each half-turn comprises two inclined portions 59 and 60 joined at an intermediate radius, for instance, at the mean radius of the ring covered by the winding. FIG. 18 shows a modification of FIG. 17 wherein a short middle portion 62 joins two inclined portions 61 and 62, such a modification being principally intended to balance the two halves of the area defined by one turn on both sides of the mean radius of the ring. The patterns of FIGS. 16 to 18 may be directly adapted to a lap type winding.

Figure 19:
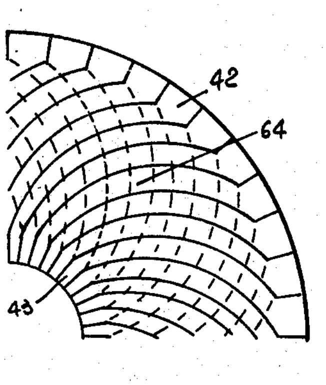
Figure 20:
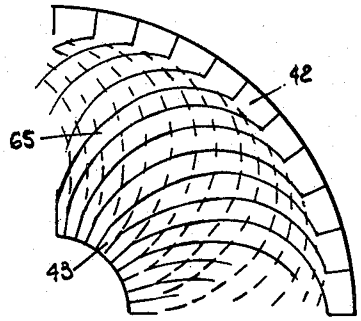

FIGS. 19 and 20 show examples of patterns in which the conductors are entirely arcuate to constitute half-turns of wave windings. The conductors 64 in FIG. 19 have a constant radius of curvature and, in FIG. 20, there is shown the limit case where the conductors 65 start as tangent lines from the inner terminals 43. Such arcuate conductor patterns are easy to obtain and quite suitable from the electrical point of view by providing fully appropriate turn surfaces of the machine.

Figure 21:
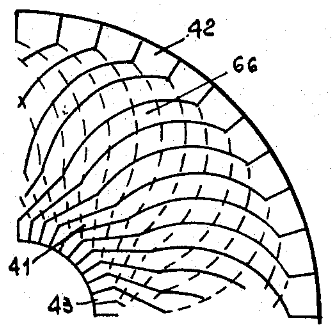

However, these patterns of FIGS. 19 and 20 cannot be used as such for lap windings. FIG. 21, preserving the inner slanted portions 41 between terminal portions 43 and arcuate conductors 66, is on the other hand adaptable to lap windings by mere reversal of direction of inclination of the said inner portions 41.

Figure 22:
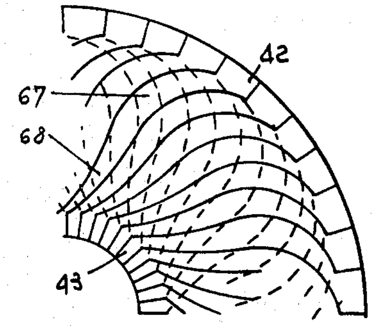

Finally, the inner portions 41 may be replaced by arcuate portions 68, FIG. 22, directly and smoothly connected in the pattern to outer arcuate portions 67 so that each conductor is substantially curvilinear with two different curvature radii in the configuration thereof.

Other variations of patterns of conductors may be provided without departing from the scope of variation of the above-illustrated examples.

As will be obvious to those skilled in the printed circuit technique, the interconnections between half-turn conductors on one face of the carrier and those on the opposite face may be completed through holes formed in the carrier at the locations of the terminal portions of the half-turn conductors.

It must be noted that such a brush arrangement as in FIG. 9 will preferably be used on winding patterns wherein the conductors are slanted or arcuate in order to avoid any parasitic effect and to consequently improve the commutator effect.

From the foregoing it will be seen that in all forms of the winding disclosed herein, the winding is formed as a relatively thin annular band surrounding a winding axis and having inner and outer boundaries of substantially different lengths, it being noted that for an annular band having circular boundaries as in FIG. 3, the outer boundary is located at the outer cross-over connections 14a and the inner circular boundary is located at the inner cross-over connections 15a. The winding is formed of two sets of conductors, each set being arranged in annular array surrounding the axis of the winding, and the conductors of each set are uniformly spaced throughout the full extent of the annular array. Also, the conductors in the two arrays are oriented so that the conductors of one array are arranged in crossing or overlapping relation with portions of conductors in the other array, and the two arrays of conductors are bonded together by intervening insulating material having intimate contact with the inner surfaces of the conductors in each array throughout the lengths of the conductors.

It will also be noted that the conductors of the two arrays are connected by bridging connections to form a series circuit in which successive conductors are located in different arrays, the conductors being connected to form successive winding loops having their planes substantially parallel with the plane of the winding band, each loop being formed on an individual radial axis which is displaced from the axes of adjacent loops. In both the wave type and lap type of winding, the loops of the winding cover or span a sector portion of the annular arrays which is relatively large with respect to the angular spacing of adjacent conductors. For example, in FIG. 3 each loop of the wave winding covers or spans an annular sector comprising a complete pole pitch which covers or spans several intervening conductors in both arrays. Also, in the lap type of winding as described above in connection with FIG. 8, each loop of winding covers a pole-pitch sector of the annular arrays which includes a number of intervening conductors. In both types of windings the radial axes of successive loops or turns are displaced angularly about the axis of the winding in uniform steps which, in the case of the lap type, would be a small fraction of a pole-pitch, and, in the case of the wave type, would be of the order of a pole-pitch.

I claim:

1. A multipolar rotary electric machine winding structure comprising a winding carrier having opposite faces thereof presenting a closed-loop winding band on each face of said carrier, each winding band having inner and outer boundaries of substantially different lengths, and a winding mounted on said carrier comprising a first set of conductors secured to one face of said carrier and arranged transversely of the winding band thereof and distributed along the length of such band, a second set of conductors secured to the opposite face of said carrier and arranged transversely of the winding band thereof and distributed along the length of said band, each conductor being individually bonded throughout its length to the adjacent surface of said carrier, and bridging connections connecting said conductors to form winding loops in at least one series circuit with successive conductors in said series circuit being in different sets, the successive conductors in the series circuit being spaced apart along said winding bands so that the planes of said winding loops are substantially parallel with the planes of the winding bands.

2. A multipolar rotary electric machine winding structure comprising a disc-like carrier having opposed substantially radially extending faces and a winding on said carrier comprising substantially radially extending conductors individually bonded throughout their lengths to said faces, said conductors being angularly spaced about the axis of said carrier, said winding further comprising bridging connections connecting said conductors in at least one series circuit, successive ones of said conductors in said series circuit being on opposite ones of said faces and successive ones of said conductors in said series circuit being angularly spaced apart about the axis of said carrier by more than one conductor spacing.

3. A multipolar rotary electric machine comprising (1) a winding member including a winding carrier having opposite faces thereof presenting a closed-loop winding band on each face of said carrier, each winding band having inner and outer boundaries of substantially different lengths, and a winding mounted on said carrier comprising a first set of conductors secured to one face of said carrier and arranged transversely of the winding band thereof and distributed along the length of such band, a second set of conductors secured to the opposite face of said carrier and arranged transversely of the winding band thereof and distributed along the length of said band, each conductor being individually bonded throughout its length to the adjacent surface of said carrier, and bridging connections connecting said conductors to form winding loops in at least one series circuit with successive conductors in said series circuit being in different sets, the successive conductors in the series circuit being spaced apart along said winding bands so that the planes of said winding loops are substantially parallel with the planes of the winding bands, and (2) magnetic-flux generating means to cause flux to pass through said winding bands, said flux generating means and said winding member being relatively rotatable with respect to each other.

4. A rotary electric machine comprising (1) a winding member including a carrier having opposed substantially radially extending faces and a winding on said carrier comprising substantially radially extending conductors individually bonded throughout their lengths to said radially extending faces, said radially extending conductors being angularly spaced about the axis of said winding member, said winding further comprising bridging connections connecting said radially extending conductors in series, successive ones of said radially extending conductors being on opposite ones of said radially extending faces and (2) magnetic-flux generating means to cause flux to pass through said radially extending faces, said winding member and said flux generating means being relatively rotatable with respect to each other.

5. A rotary electric machine comprising (1) a winding member including a sheet-like carrier having opposed substantially radially extending faces and a winding on said carrier comprising substantially radially extending thin and flat conductors individually bonded throughout their lengths to said radially extending faces, said radially extending conductors being angularly spaced about the axis of said winding member, said winding further comprising bridging connections connecting said radially extending conductors in series, successive ones of said radially extending conductors being on opposite ones of said radially extending faces and (2) means defining a magnetic circuit including an airgap, and (3) means mounting said winding member for rotation so as to rotate said winding in said airgap, the width of said airgap in the direction of the flux in the airgap being only slightly greater than the thickness of said winding member.

6. A multipolar rotary electric machine comprising (1) a winding member including a winding carrier having opposite faces thereof presenting a closed-loop winding band on each face of said carrier, each winding band having inner and outer boundaries of substantially different lengths, and a winding mounted on said carrier comprising a first set of conductors secured to one face of said carrier and arranged transversely of the winding band thereof and distributed along the length of such band, a second set of conductors secured to the opposite face of said carrier and arranged traansversely of the winding band thereof and distributed along the length of said band, each conductor being individually bonded throughout its length to the adjacent surface of said carrier, and bridging connections connecting said conductors to form winding loops in at least one series circuit with successive conductors in said series circuit being in different sets, the successive conductors in the series circuit being spaced apart along said winding bands so that the planes of said winding loops are substantially parallel with the planes of the winding bands, (2) magnetic-flux generating means to cause flux to pass through said winding bands, and (3) a member of magnetic material on the opposite side of said carrier from said flux generating means defining a low reluctance return path for said flux, said winding member being rotatable with respect to said flux generating means and said low reluctance means.

7. A multipolar winding formed as a sheet-like annular band having opposed annular faces, said annular faces each having inner and outer boundaries of substantially different lengths, said winding comprising a first set of conductors arranged in an annular array about a common axis and forming one of said annular faces, a second set of conductors arranged in an annular array about said common axis and forming the other said annular face, said conductors of said first and second sets being thin and of relatively large width in the planes of their respective arrays and substantially completely covering said annular faces of said band with relatively narrow insulating gaps between adjacent conductors, and bridging connections connecting said conductors to form winding loops in at least one series circuit with successive conductors in said series circuit being in different arrays, the successive conductors in the series circuit being spaced apart circumferentially of the annular winding so that the planes of said winding loops are substantially parallel with the planes of the winding bands.

8. A multipolar winding formed as a relatively thin annular band having inner and outer boundaries of substantially different lengths, comprising a first set of conductors arranged in an annular array about a common axis, a second set of conductors arranged in a second annular array about said axis and arranged in juxtaposition with said first annular array on said axis, the conductors in each set being thin and flat in the planes of their respective arrays and being substantially uniformly distributed angularly about said axis, each end of each conductor in each array being arranged opposite an end of another conductor in the opposite array, the conductors in one array being arranged in crossing relation with respect to the conductors of the other array, electric connections extending directly between opposed pairs of conductor ends in the two arrays and connecting the conductors in both arrays to form successive loops in an annular winding in which successive conductors are located in separate arrays and each winding loop being formed in a plane substantially parallel with the plane of the annular winding, said connections being confined within the space between the two planes of the outer faces of said arrays, and means for insulating the inner surfaces of the conductors in the two arrays.

9. A multipolar winding formed as a relatively thin annular disc having inner and outer boundaries of substantially different lengths, comprising a first set of conductors arranged in an annular array about a common axis, a second set of conductors arranged in a second annular array about said axis and arranged in juxtaposition with said first annular array on said axis, the conductors in each set being thin and flat in the planes of their respective arrays and being substantially uniformly distributed angularly about said axis, each end of each conductor in each array being arranged opposite an end of another conductor in the opposite array, the conductors in one array being arranged in crossing relation with respect to the conductors of the other array, electric connections extending directly between opposed pairs of conductor ends in the two arrays and connecting the conductors in both arrays to form successive loops in an annular winding in which successive conductors are located in separate arrays and each winding loop being formed in a plane substantially parallel with the plane of the annular winding, said connections being confined within the space between the two planes of the outer faces of said arrays, and insulating means interposed between said arrays and bonding together the inner surfaces of the conductors in the two arrays.

10. An electrical winding structure comprising a carrier formed of sheet-like material extending substantially radially and circumferentially about a carrier axis, a plurality of electrical conductors intimately bonded throughout their lengths to one face of said carrier, said conductors extending generally radially about said carrier axis and being uniformly spaced in an annular array surrounding said axis, and connections carried on the opposite face of said carrier connecting said conductors in a series circuit formed of successive loops distributed about said annular array and having their planes substantially parallel with said one face of said carrier, the sector of said annular array covered by each loop being large relative to the circumferential spacing of adjacent conductors in said annular array, and each loop being formed on an individual radial axis which is displaced from the axes of adjacent loops.

11. A rotating electric machine of the axial air-gap type, comprising a stator inductor having magnetic poles uniformly distributed over an annular area and alternating in polarity about said annular area, an annular magnetic member having flat annular surfaces facing the pole faces of said magnetic poles and providing an annular air-gap between said stator poles and said annular magnetic member, a disc-shaped rotor member mounted within said air-gap and having a winding thereon consisting of two annular arrays of flat conductors carried on opposite faces of an annular portion of said rotor member mounted within said annular air-gap, the conductors of each array being insulated from each other and having their broad faces intimately bonded throughout their lengths to the respective faces of said rotor member, the conductors of each array extending generally radially of said rotor and being uniformly distributed over said annular rotor member portion located within said air-gap, each conductor forming a half-turn of the winding, the ends of said conductors being connected from one array to the other one in a series circuit in which successive conductors are located in different arrays, the active conductor portions which pass through the magnetic flux in the air-gap being of small thickness and of relatively large width, said active portions being sector-shaped and covering the entire annular area of the rotor member traversed by the magnetic field except for narrow gaps between adjacent active sections of said conductors.

12. An electrical winding structure according to claim 1 and including means mounting said winding carrier for rotation on the axis of said annular surfaces, and at least one brush mounted in a position to engage the conductors carried on one face of said carrier.

13. An electrical structure according to claim 12 wherein said brush is located adjacent one edge of the annular winding surface and engages end portions of the conductors traversing said winding surface, and including a second brush mounted to engage the conductors on the opposite face of said winding carrier at a point opposite the point of engagement by said first brush.

14. A rotary electric machine comprising a winding structure according to claim 1 wherein said carrier comprises a flat disc, means mounting said disc for rotation about its axis, a magnetic field structure comprising an annular ring of magnetic material mounted coaxially with said disc and parallel with said disc but spaced therefrom, a plurality of permanent-magnet pole elements supported on said magnetic ring between said disc and said ring and being equally spaced angularly about the axis of said ring, said pole elements presenting flat pole faces adjacent said disc, alternate poles being of opposite polarity.

15. A machine according to claim 14 and including a second magnetic ring arranged concentric with the axis of said disc and positioned between said disc and said first magnetic ring and being magnetically coupled to said pole elements, and means mounting said second magnetic ring for movement axially of said first ring to vary the shunting effect of said second ring upon said pole elements.

16. A winding structure according to claim 1 wherein said carrier comprises a flat disc of dielectric material, and a rigid disc of conducting material bonded to one face of said winding structure, said rigid disc having apertures formed therein throughout its surface to reduce the effects of eddy currents formed therein.

17. A winding structure according to claim 1 wherein said carrier comprises a thin flexible and non-self-supporting sheet of insulating material, and said winding structure is applied to one face of a rigid backing disc.

18. A rotating electric machine of the axial air-gap type, comprising a stator inductor having magnetic poles uniformly distributed over an annular area and alternating in polarity about said annular area, an annular magnetic member having a flat annular surface facing the pole faces of said magnetic poles and providing an annular air-gap between said stator poles and said annular magnetic member, a disc-shaped rotor member mounted within said air-gap and having a winding thereon consisting of two annular arrays of flat conductors carried on opposite faces of an annular portion of said rotor member mounted within said annular air-gap, the conductors of each array being insulated from each other and having their broad faces intimately bonded throughout their lengths to the respective faces of said rotor member, the conductors of each array extending generally radially of said rotor and being uniformly distributed over said annular rotor member portion located within said air-gap, each conductor forming a half-turn of the winding, the ends of said conductors being connected from one array to the other one in a series circuit in which successive conductors are located in different arrays, and stationary current translating means located adjacent said rotor and in a position to engage a bare portion of each half-turn conductor carried on one face of said annular rotor member upon rotation of said rotor.

19. A machine according to claim 18, wherein said current translating means comprises an arrangement of brushes including means for elastically pressing said brushes in a direction perpendicular to the rotor plane and into contact with half-turn conductors of at least one array in the winding, said conductors acting as commutator segments for said brushes.

20. A machine according to claim 18, wherein each half-turn conductor comprises a substantially radial portion terminated at each end by portions of greater inclination, and wherein said current translating means comprise brushes bearing against the inclined end portions of the half-turn conductors.

21. A rotor member for a rotating electric machine of the axial air-gap type, comprising a disc-shaped carrier member having a winding thereon consisting of two annular arrays of flat conductors carried on opposite faces of an annular portion of said carrier member, the conductors of each array being insulated from each other and having their broad faces intimately bonded throughout their lengths to the respective faces of said carrier member, the conductors of each array extending generally radially of said rotor and being uniformly distributed over said annular portion of said carrier member, each conductor forming a half-turn of the winding, the ends of said conductors being connected from one array to the other one in a series of circuit in which successive conductors are located in different arrays, the active conductor portions which traverse said annular portion of said carrier being of small thickness and of relatively large width, said active portions being sector-shaped and covering the entire annular area of the carrier member except for narrow gaps between adjacent active sections of said conductors.

22. A rotor winding structure according to claim 1 and including a continuous annulus of conducting material incorporated within said winding structure and having eddy currents generated therein upon rotation of said winding structure within a magnetic field, whereby a damping effect is imposed on said rotating winding structure.

23. In a D.C. motor having a plurality of magnetic poles spaced about the axis of the motor, a disk-shaped printed circuit rotor comprising a rotor disk, printed-circuit conductor means on opposite faces of said disk, said printed-circuit conductor means being connected together to form a winding distributed on the two faces of said disk, said winding comprising a plurality of winding loops distributed about the perimeter of said disk, each individual loop being formed of a first conductor portion located on one face of said disk and extending from a point near the center of the disk to a point near the outer periphery of the disk, and a second conductor portion located on the opposite face of said disk and connected to the outer end of said first conductor portion at the outer periphery of the disk and terminating at a point near the center of the disk, the mid sections of said conductor portions being spaced apart circumferentially of said disk by an angular spacing substantially equal to one pole pitch, each loop being formed on an individual radial axis which is displaced from the radial axes of adjacent loops, and face-to-face connections near the center of said disk extending from each loop terminal on one face of said disc to other loop terminals on the opposite face of the disk and connecting said winding loops in series circuit relation.

24. A motor according to claim 23 wherein the spacing between adjacent loop axes is less than the circumferential span of the loops, whereby the loops are arranged in overlapping relation.

References Cited in the file of this patent

UNITED STATES PATENTS

| | | |
|---|---|---|
| 2,579,318 | Hershberger | Dec. 18, 1951 |
| 2,677,777 | West et al. | May 4, 1954 |
| 2,847,589 | Haydon | Aug. 12, 1958 |
| 2,970,238 | Swiggett | Jan. 31, 1961 |